(12) United States Patent
Shibata et al.

(10) Patent No.: US 10,023,385 B2
(45) Date of Patent: Jul. 17, 2018

(54) ARTICLE STORAGE FACILITY

(71) Applicant: Daifuku Co., Ltd., Osaka-shi (JP)

(72) Inventors: Suguru Shibata, Komaki (JP); Hiroshi Otsuka, Komaki (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 15/035,769

(22) PCT Filed: Nov. 12, 2013

(86) PCT No.: PCT/JP2013/080534
§ 371 (c)(1),
(2) Date: May 11, 2016

(87) PCT Pub. No.: WO2015/071951
PCT Pub. Date: May 21, 2015

(65) Prior Publication Data
US 2016/0289001 A1    Oct. 6, 2016

(51) Int. Cl.
*B65G 1/04*    (2006.01)
*B65G 1/06*    (2006.01)
(Continued)

(52) U.S. Cl.
CPC ......... *B65G 1/0485* (2013.01); *B65G 1/0435* (2013.01); *B65G 1/0464* (2013.01);
(Continued)

(58) Field of Classification Search
CPC .. B65G 1/0435; B65G 1/0464; B65G 1/0485; B65G 1/0492; B65G 1/06; B65G 65/00;
(Continued)

(56) References Cited

U.S. PATENT DOCUMENTS

| | | | |
|---|---|---|---|
| 6,540,466 B2 * | 4/2003 | Bachrach | H01L 21/67727 118/719 |
| 8,231,381 B2 * | 7/2012 | Hishiya | H01L 21/67109 414/938 |
| 8,814,488 B2 * | 8/2014 | Aburatani | H01L 21/67769 414/217 |
| 9,168,930 B2 * | 10/2015 | Wada | B61B 3/02 |
| 9,199,826 B2 * | 12/2015 | Shibata | H01L 21/67727 |

(Continued)

FOREIGN PATENT DOCUMENTS

| | | |
|---|---|---|
| CN | 202321418 U | 7/2012 |
| JP | 1149310 U | 10/1989 |

(Continued)

*Primary Examiner* — Saul Rodriguez
*Assistant Examiner* — Ashley K Romano
(74) *Attorney, Agent, or Firm* — The Webb Law Firm

(57) ABSTRACT

An article storage facility is provided in which a back side transport device can be installed while reducing any reduction in the storage efficiency of the article storage facility. A back side transport device (4) is provided which can support and transport an article (W) between an outside location (P1) located rearward of a back face of the article storage rack (2) and an inside location (P2) located forwardly of the back face of the article storage rack (2). The inside location (P2) is defined between storage sections (1) arranged along the rack vertical direction. And the back side transport device (4) includes a receiving support portion (20) for receiving and supporting an article (W), and an actuating operation portion (21) for actuating the receiving support portion (20) in order to move the article (W) to the inside location (P2) and to the outside location (P1). The actuating operation portion (21) is provided rearward of articles (W) stored in the storage sections (1) along the rack fore and aft direction.

4 Claims, 5 Drawing Sheets

(51) Int. Cl.
    *B65G 65/00* (2006.01)
    *H01L 21/677* (2006.01)

(52) U.S. Cl.
    CPC ............ *B65G 1/0492* (2013.01); *B65G 1/06* (2013.01); *B65G 65/00* (2013.01); *H01L 21/67724* (2013.01); *H01L 21/67733* (2013.01); *H01L 21/67766* (2013.01); *H01L 21/67769* (2013.01); *B65G 2201/0297* (2013.01); *B65G 2249/02* (2013.01)

(58) Field of Classification Search
    CPC ........ B65G 2201/0297; B65G 2249/02; H01L 21/67724; H01L 21/67733; H01L 21/67766; H01L 21/67769
    See application file for complete search history.

(56) References Cited

U.S. PATENT DOCUMENTS

2002/0048509 A1    4/2002  Sakata et al.

FOREIGN PATENT DOCUMENTS

| JP | 374508 U | 7/1991 |
| JP | 2002164406 A | 6/2002 |
| JP | 2008174357 A | 7/2008 |
| JP | 2010111476 A | 5/2010 |
| JP | 2011157184 A | 8/2011 |
| JP | 201431271 A | 2/2014 |
| WO | 2010106659 A1 | 9/2010 |

\* cited by examiner

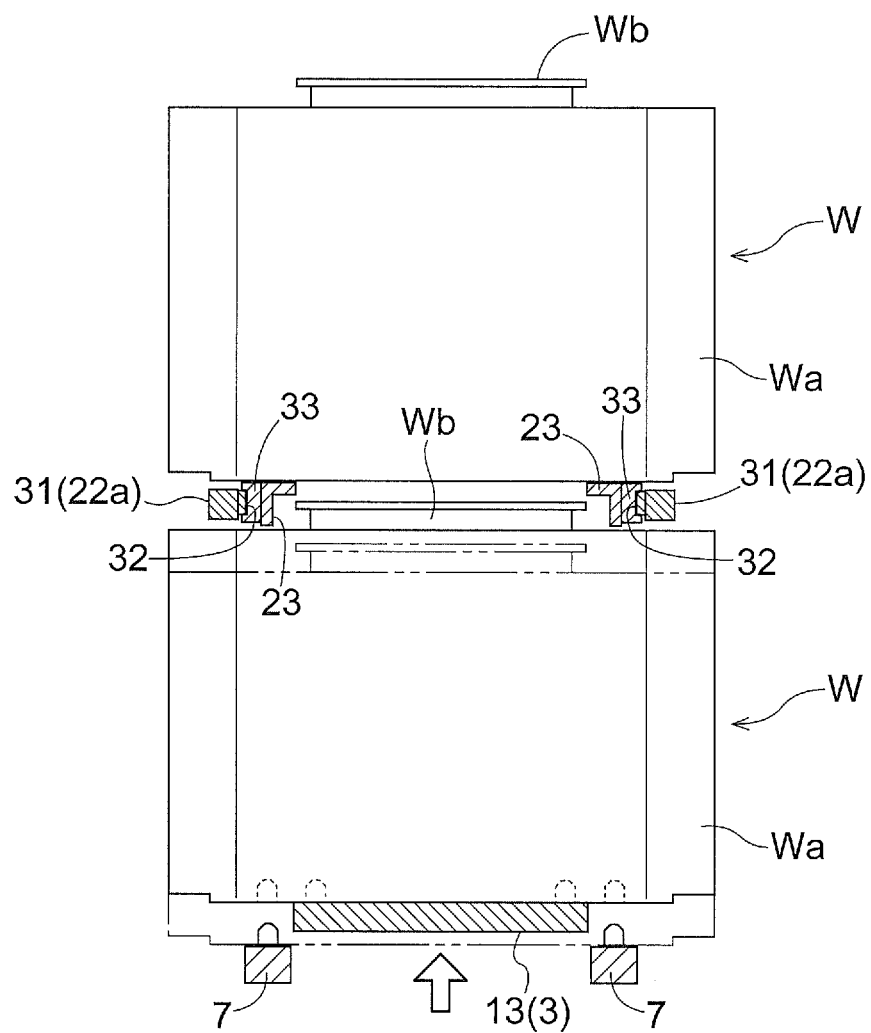

ARTICLE STORAGE FACILITY

CROSS-REFERENCE TO RELATED APPLICATION

This application is the United States national phase of International Application No. PCT/JP2013/080534 filed Nov. 12, 2013, the disclosure of which is hereby incorporated in its entirety by reference.

TECHNICAL FIELD

The present invention relates to an article storage facility comprising an article storage rack including storage sections for storing articles with the storage sections being arranged along a rack vertical direction, a front side transport device provided in front of the article storage rack in a rack fore and aft direction for carrying in and out articles to and from the storage sections, a back side transport device which can support and transport an article between an outside location located rearward of a back face of the article storage rack along the rack fore and aft direction and an inside location located forwardly of the back face of the article storage rack along the rack fore and aft direction, wherein the inside location is defined between the storage sections arranged along the rack vertical direction, and wherein the front side transport device is configured to be capable of transporting an article between the inside location and the storage sections.

BACKGROUND ART

The article storage facility described above is configured to transport an article at an outside location to an inside location by means of a back side transport device, and to transport the article at the inside location to a storage section of an article storage rack by means of a front side transport device to store the article in the article storage rack; and is configured to transport an article stored in a storage section to the inside location by means of the front side transport device and to transport the article at the inside location to the outside location by means of the back side transport device to take out the article from the article storage rack. And a reduction in the size of the article storage facility is attempted by defining the inside location between storage sections arranged along a rack vertical direction and installing the back side transport device using a part of the article storage rack.

As an example of such an article storage facility, there exists an article storage facility in which the back side transport device includes a travel member having a receiving support portion and an actuating operation portion, and which is configured to cause an article received and supported by the receiving support portion to be moved between an inside location and an outside location by causing the travel member to travel along a rack fore and aft direction by means of the actuating operation portion (see, for example, Patent Document 1).

PRIOR ART DOCUMENTS

Patent Document

Patent Document 1: JP Publication of Application No. 2011-157184

SUMMARY OF THE INVENTION

Problems to be Solved by the Invention

However, in the article storage facility of Patent Document 1 described above, when an article is moved to the inside location, the actuating operation portion and the receiving support portion move into the space between the article located at the inside location and an article stored in a storage section located downwardly adjacent the inside location. Thus, large space along the rack vertical direction is required between the inside location and the storage section located downwardly adjacent the inside location so that the actuating operation portion and the receiving support portion can move; therefore, a strong constraint is imposed on the area in which storage sections can be installed when a back side transport device is installed. This reduces the number of storage sections which can be provided in the article storage rack, leading to a large reduction in the storage efficiency of the article storage facility. In Patent Document 1, for example, three storage sections cannot be provided along the rack vertical direction as a result of providing the back side transport device.

In light of the background described above, an article storage facility is desired in which a back side transport device can be installed while reducing any reduction in the storage efficiency of the article storage facility.

Means for Solving the Problems

An article storage facility in accordance with the present invention comprises: an article storage rack including storage sections for storing articles with the storage sections being arranged along a rack vertical direction; a front side transport device provided in front of the article storage rack in a rack fore and aft direction for carrying in and out articles to and from the storage sections; a back side transport device which can support and transport an article between an outside location located rearward of a back face of the article storage rack along the rack fore and aft direction and an inside location located forwardly of the back face of the article storage rack along the rack fore and aft direction; wherein the inside location is defined between the storage sections arranged along the rack vertical direction, and wherein the front side transport device is configured to be capable of transporting an article between the inside location and the storage sections. The back side transport device includes a receiving support portion for receiving and supporting an article, and an actuating operation portion for actuating the receiving support portion in order to move an article to the inside location and to the outside location. And the actuating operation portion is provided rearward of articles stored in the storage sections along the rack fore and aft direction.

That is, an article received and supported by the receiving support portion can be moved to the inside location and to the outside location by moving the receiving support portion along the rack fore and aft direction with the actuating operation portion.

And the actuating operation portion is provided rearward, along the rack fore and aft direction, of articles stored in the storage sections; thus, even when the article has been moved to the inside location by the back side transport device, the actuating operation portion is not located between an article located at the inside location and an article stored in the storage section located downwardly adjacent the inside location. Thus, there is no need for space, that is large along the rack vertical direction, to place the actuating operation portion between the inside location and the storage section located downwardly adjacent the inside location. Thus, the back side transport device can be installed while reducing any reduction in the storage efficiency of the article storage facility.

Examples of preferred embodiments of the present invention are described next.

In an embodiment of the article storage facility in accordance with the present invention, the receiving support portion preferably includes a receiving member for receiving and supporting an article and movable along the rack fore and aft direction, and an operatively connecting portion for operatively connecting the receiving member and the actuating operation portion to move the receiving member along the rack fore and aft direction when actuated by the actuating operation portion, wherein the operatively connecting portion is preferably connected to a back side end portion, along the rack fore and aft direction, of the receiving member, and is provided rearward of articles stored in the storage sections along the rack fore and aft direction.

That is, arrangements are made so that, by moving the operatively connecting portion with the actuating operation portion, the receiving member is moved along the rack fore and aft direction in unison with the movement of the operatively connecting portion, to cause an article to be moved to the inside location and to the outside location.

And in addition to the actuating operation portion, the operatively connecting portion is also provided rearward, along the rack fore and aft direction, of articles stored in the storage sections; thus, even when the article has been moved to the inside location, the actuating operation portion and the operatively connecting portion are not located between an article located at the inside location and an article stored in the storage section located downwardly adjacent the inside location. Thus, there is no need for space, that is large along the rack vertical direction, to place the actuating operation portion and the operatively connecting portion between the inside location and the storage section located downwardly adjacent the inside location. Thus, the back side transport device can be installed while reducing any reduction in the storage efficiency of the article storage facility.

In an embodiment of the article storage facility in accordance with the present invention, the operatively connecting portion preferably consists of a bar-shaped link whose proximal end portion is connected to the actuating operation portion and whose distal end portion is connected to the back side end portion of the receiving member, wherein the actuating operation portion is preferably configured to move the receiving member along the rack fore and aft direction by rocking the link, and is provided at an intermediate position in a moving range, along the rack fore and aft direction, of the distal end portion of the link.

That is, arrangements are made so that, by rocking the link with the actuating operation portion, receiving member is moved along the rack fore and aft direction, as the operatively connecting portion is moved, to move an article to the inside location and to the outside location.

And since the actuating operation portion is provided at an intermediate position in the moving range, along the rack fore and aft direction, of the distal end portion of the link, when the receiving member has been moved to a position corresponding to the outside location, the attitude of the link is tilted toward the back side from the attitude of the link along the rack lateral direction. In addition, when the receiving member has been moved to a position corresponding to the inside location, the attitude of the link is tilted toward the front side from the attitude of the link along the rack lateral direction.

Thus, when the link is rocked by the actuating operation portion to move the receiving member to a position corresponding to the inside location and to a position corresponding to the outside location, the attitude of the link is changed from an attitude that is tilted toward one side along the rack fore and aft direction, through an attitude that is perpendicular to the rack fore and aft direction, and to an attitude that is tilted toward the other side along the rack fore and aft direction.

The moving speed of the receiving member increases gradually when the attitude of the link is changed from the attitude that is tilted toward one side along the rack fore and aft direction to the attitude that is perpendicular to the rack fore and aft direction whereas the moving speed of the receiving member decreases gradually when the attitude of the link is changed from the attitude that is perpendicular to the rack fore and aft direction to the attitude that is tilted toward the other side along the rack fore and aft direction. Therefore, without changing the actuating speed of the actuating operation portion, the receiving member can be moved to the position corresponding to the inside location or to the outside location with the moving speed of the receiving member being increased gradually and thereafter decreased gradually, even when the angular speed of the rocking link is held constant.

In an embodiment of the article storage facility in accordance with the present invention, the article storage rack preferably includes the storage sections with the storage sections being arranged along a rack lateral direction, wherein the inside location is preferably defined between the storage sections arranged along the rack lateral direction, and wherein the width, along the rack lateral direction, of the back side transport device is preferably formed to be narrower than the width, along the rack lateral direction, of an article.

That is, since the back side transport device is formed such that its width, along the rack lateral direction, is narrower than the width, along the rack lateral direction, of an article, there is no need to provide large installation space between the inside location and storage sections that are adjacent to the inside location along the rack lateral direction to prevent any interference, or contact, between the back side transport device and any articles stored in the storage sections; thus, the back side transport device can be installed while reducing any reduction in the storage efficiency of the article storage facility.

In an embodiment of the article storage facility in accordance with the present invention, a ceiling transport vehicle is preferably provided which is capable of traveling along a travel rail while guided and supported by the travel rail installed to a ceiling, and which includes a support body for supporting an article such that the support body can be vertically moved, wherein the travel rail is preferably provided so as to extend above the outside location, and wherein the ceiling transport vehicle is preferably configured to vertically move the support body to transfer an article to and from the outside location.

That is, when articles are transferred by the ceiling transport vehicle, the back side transport device is provided such that it is spaced apart downwardly from the ceiling so that the ceiling transport vehicle can travel in space between the back side transport device and the ceiling. And the back side transport device is provided such that it is spaced apart upwardly from the floor surface in order to reduce the vertical distance over which the support body is vertically moved by the ceiling transport vehicle. In the back side transport device so provided, the inside location is often located between the storage sections arranged along the rack vertical direction. Thus, in the facility in which articles are transported by a ceiling transport vehicle in this manner, the back side transport device can be installed while reducing any reduction in the storage efficiency of the article storage facility by utilizing a back side transport device in which the actuating operation portion is provided rearward, along the rack fore and aft direction, of the articles stored in the storage sections even when the inside location is defined between the storage sections arranged along the rack vertical direction.

BRIEF DESCRIPTION OF THE DRAWINGS

FIG. 6 is a front view showing an inside location and a storage section.

MODES FOR CARRYING OUT THE INVENTION

The embodiments of the present invention are described next with reference to the drawings.

Figure 1:
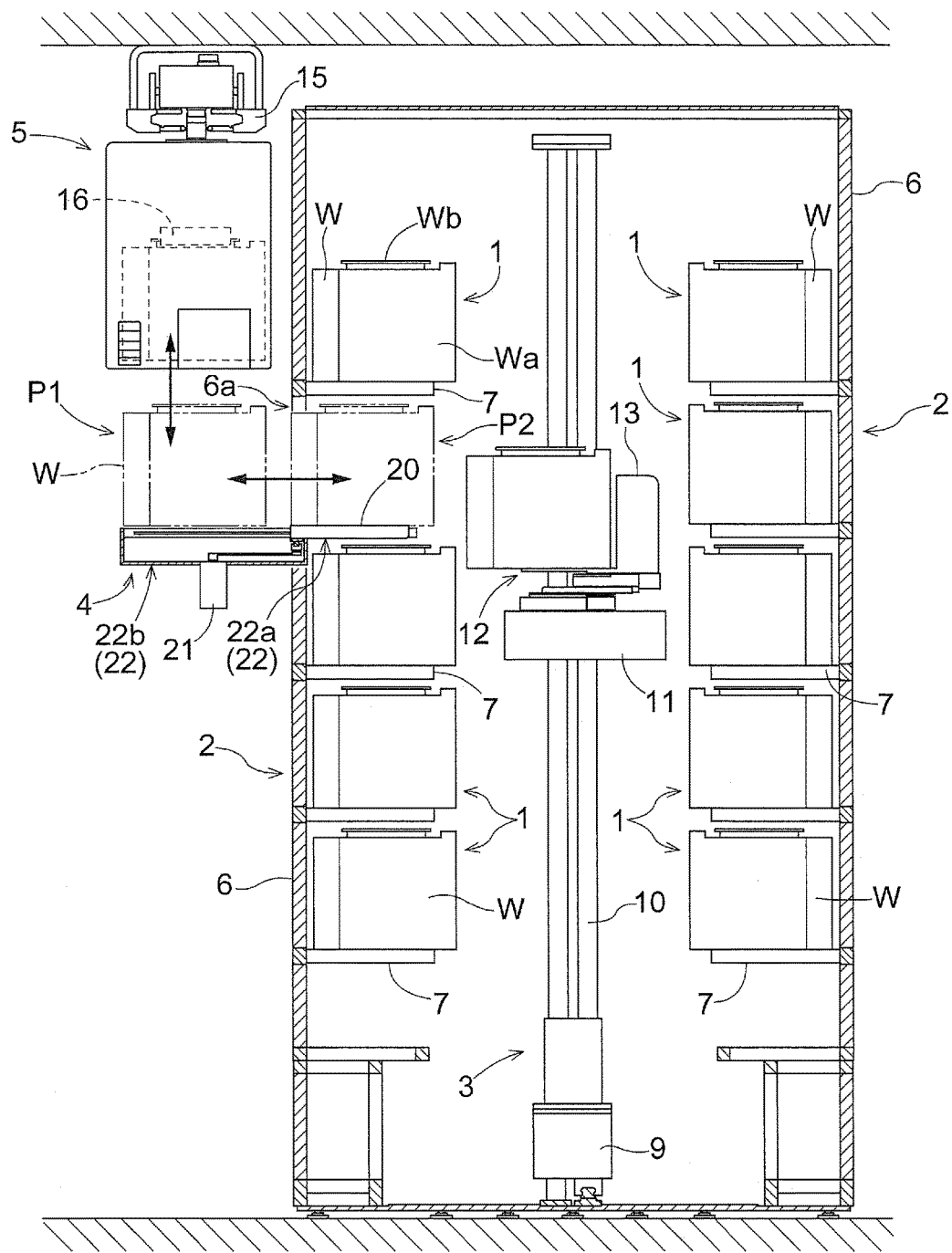
FIG. 1 is a side view of an article storage facility.

As shown in FIG. 1, the article storage facility includes an article storage rack 2 having a plurality of storage sections 1 for storing articles with the storage sections 1 arranged along a rack vertical direction and a rack lateral direction, a stacker crane 3 provided forwardly, or in front, of a front face of the article storage rack 2 and configured to transport articles W between an inside location P2 and a plurality of storage sections 1 to carry in and carry out the articles W to and from the plurality of storage sections 1, a relay transport device 4 for supporting and transporting articles W between an outside location P1 located rearward of a back face of the article storage rack 2 and the inside location P2 located forwardly of the back face of the article storage rack 2, and a ceiling, or an overhead, transport vehicle 5 provided rearward of the back face of the article storage rack 2 for transporting an article W to or from the outside location P1.

Note that the stacker crane 3 is, or corresponds to, the front side transport device whereas the relay transport device 4 is, or corresponds to, the back side transport device.

The article storage facility is installed in a clean room and FOUPs (Front Opening Unified Pod) for holding semiconductor wafers are stored in the storage sections 1 as articles W.

To this end, a top flange Wb is provided in a top surface of a container main body Wa of the article W. And a bottom surface of the container main body Wa of the article W is provided with recessed portions (not shown).

And when storing an article W to a storage section 1, the article storage facility is configured: to transport the article W to the outside location P1 by means of the ceiling transport vehicle 5; to transport the article W at the outside location P1 to the inside location P2 by means of the relay transport device 4; to transport the article W at the inside location P2 to the storage section 1 of the article storage rack 2 by means of the stacker crane 3 to store the article W in the storage section 1.

In addition, when taking out an article W from a storage section 1, the article storage facility is configured to: transport the article W stored in the storage section 1 to the inside location P2 by means of the stacker crane 3; to transport the article W at the inside location P2 to the outside location P1 by means of the relay transport device 4; and to transport the article W at the outside location P1 by means of the ceiling transport vehicle 5 to take out the article W from the storage section 1.

In addition, the article storage facility has a separating walls 6 for separating the inside in which the article storage rack 2 and the stacker crane 3 are provided and the outside where the ceiling transport vehicle 5 is provided. These separating walls 6 are integrally provided to the article storage rack 2, and the back face of the article storage rack 2 is formed or defined by an outside face of the separating wall 6.

As shown in FIG. 1, the back side of each storage section 1 is closed by a separating wall 6 whereas its front face defines a frontage portion. And the frontage portion of the front face is configured to allow an article W to be carried in and out. In addition, each of the storage sections 1 is provided with a support platform 7 and is configured to store an article W in the storage section 1 with the article W received and supported by the support platform 7.

The support platform 7 is not provided to a part of the article storage rack 2 and a relay transport device 4 is provided. This relay transport device 4 is provided to span between the inside and the outside of the separating wall 6. In addition, an opening 6a is formed in the separating wall 6 for providing the relay transport device 4 and for allowing the articles W supported and transported by the relay transport device 4 to pass through.

A pair of article storage racks 2 are provided in the inside separated by the separating walls 6 such that the article storage racks 2 face each other. And storage sections 1 are provided in one of the article storage racks 2 such that they are arranged along the rack vertical direction and the rack lateral direction at the same intervals as in the other article storage rack 2. And the pair of article storage racks 2 are formed to be of the same size. However, the relay transport device 4 is provided in one of the article storage racks 2 as described above, using a portion at which one storage section 1 is formed in the other of the article storage racks 2. Thus, the number of the storage sections 1 in one article storage rack 2 is one less than the other article storage rack 2.

Figure 2:
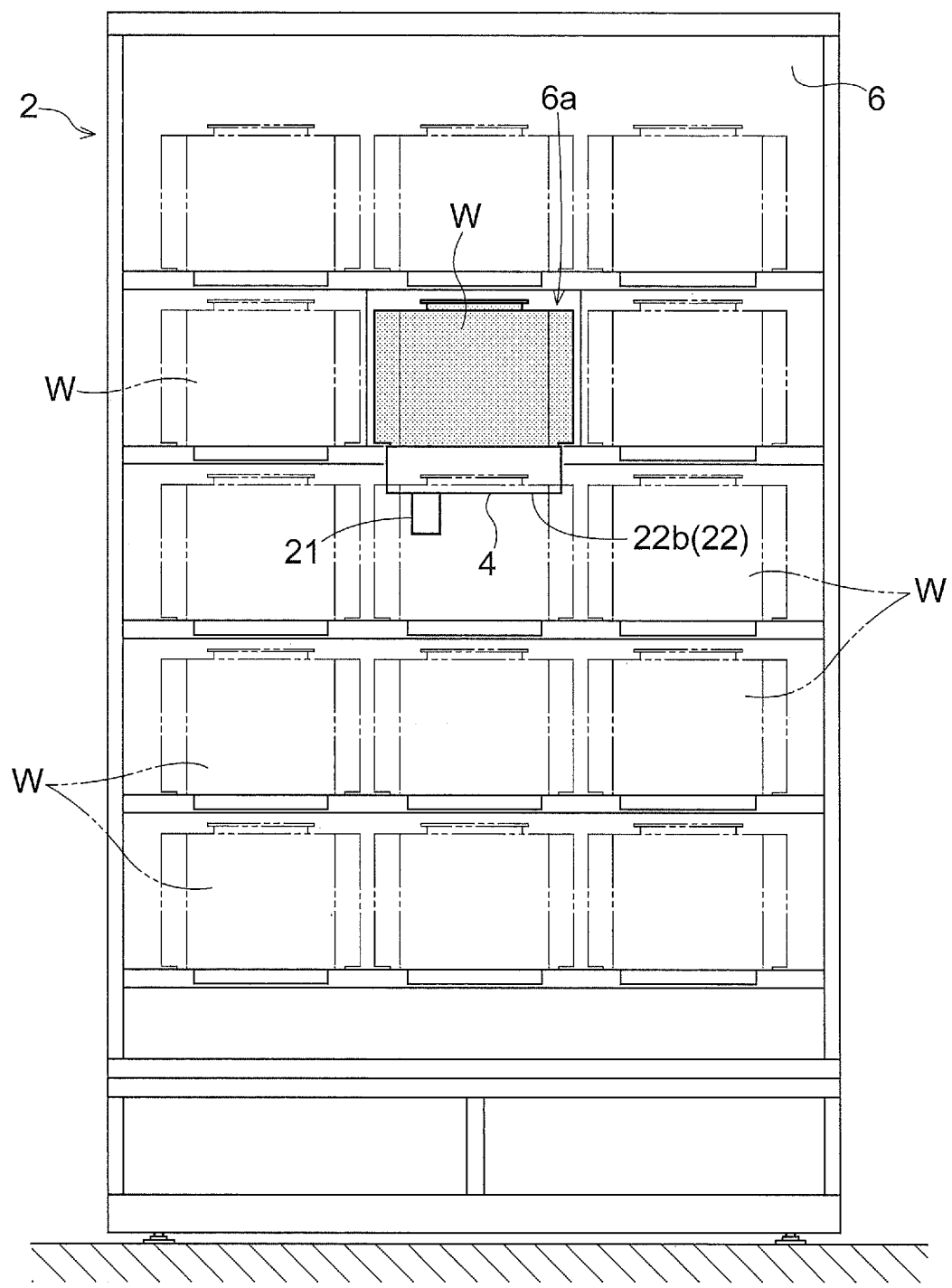
FIG. 2 is a front view of the article storage facility.

And as shown in FIGS. 1 and 2, the inside location P2 to which an article W is transported by the relay transport device 4 is defined between the storage sections 1 arranged along the rack vertical direction and between the storage sections 1 arranged along the rack lateral direction.

In this manner, in one of the article storage racks 2, the relay transport device 4 is provided in lieu of one storage section 1 to define the inside location P2.

As shown in FIG. 1, the stacker crane 3 includes a movable member 9 for moving along the rack lateral direction and along a rail installed on the floor surface, a guide mast 10 provided to the movable member 9 to stand erect thereon, and a vertically movable platform 11 guided and supported by the guide mast 10 to be vertically movable therealong. A transfer device 12 for transferring an article W between a storage section 1 or the relay transport device 4 and itself (vertically movable platform 11) is received and supported by the vertically movable platform 11 such that the transfer device 12 can be turned about a vertical axis.

The transfer device 12 is configured to be capable of projecting and retracting a receiving and supporting member 13 for receiving and supporting an article W between a projected position at which the receiving and supporting member 13 is projected toward the article storage rack 2 and a retracted position at which the receiving and supporting member 13 is retracted toward the stacker crane 3. In addition, the transfer device 12 is configured to be capable of changing the projecting direction of the receiving and supporting member 13 between a direction toward one of the article storage racks 2 and a direction toward the other of the article storage racks 2, by turning about the vertical axis.

And the stacker crane 3: causes the receiving and supporting member 13 to be projected to the projected position with the vertically movable platform 11 located at a pick up position for a storage section 1 or the relay transport device 4; causes the vertically movable platform 11 to be raised to an unloading position which is higher than the pick up position; and causes the receiving and supporting member 13 to be retracted to the retracted position, to cause it to perform a pick up operation. The stacker crane 3 is configured to transfer an article W from a storage section 1 or the relay transport device 4 to the transfer device 12 through this pick up operation.

In addition, the stacker crane 3 causes the receiving and supporting member 13 to be moved to the projected position with the vertically movable platform 11 located at the unloading position for the storage section 1 or the relay transport device 4; causes the vertically movable platform 11 to be moved to the pick up position; and causes the receiving and supporting member 13 to be moved to the retracted position, to cause it to perform an unloading operation. The stacker crane 3 is configured to transfer an article W from the transfer device 12 to a storage section 1 or the relay transport device 4 through this unloading operation.

The ceiling transport vehicle 5 is configured to be capable of traveling along the travel rails 15 with the ceiling transport vehicle 5 guided and supported by the travel rails 15 provided to the ceiling, and is provided with a support body 16 for supporting an article W by gripping or holding the top flange Wb, such that the support body 16 can be vertically moved. The travel rails 15 are provided such that they extend through an area above (in the present example, directly above) the outside location P1. And the ceiling transport vehicle 5 is configured to transfer the article W to and from the outside locations P1 by vertically moving the support body 16.

In other words, the ceiling transport vehicle 5 is configured to deliver the article W to the outside location P1 by causing the support body 16 supporting the article W to be lowered, releasing the support of the article W by the support body 16, and causing the support body 16 not supporting the article W to be raised, with the travel portion stopped directly above the outside location P1. In addition, the ceiling transport vehicle 5 is configured to receive an article W from the outside location P1 by causing the support body 16 not supporting any article W to be lowered, supporting the article W located at the outside location P1 with the support body 16, and causing the support body 16 supporting the article W to be raised, with the travel portion stopped directly above the outside location P1.

Figure 3:
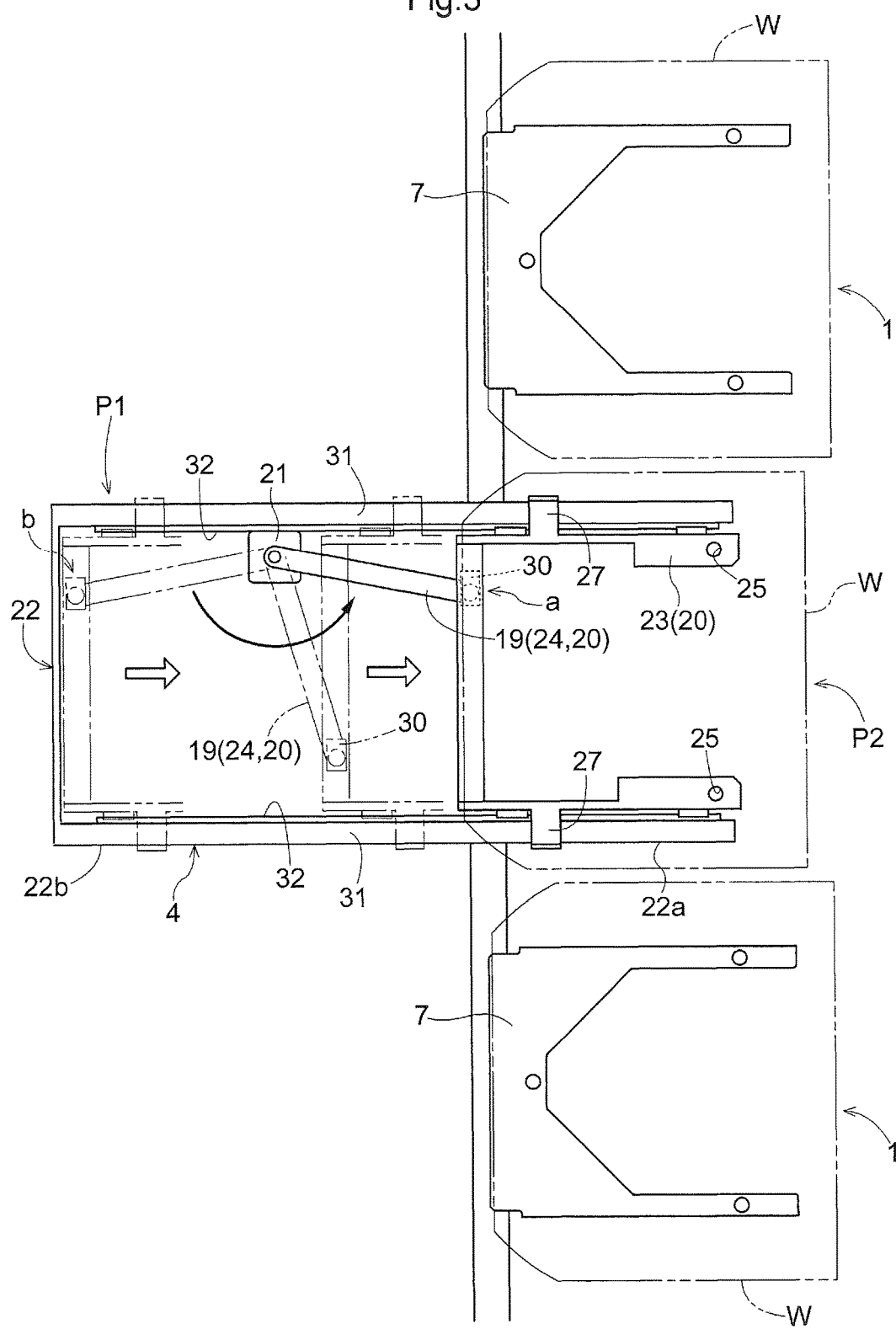
FIG. 3 is a plan view of a relay transport device.
Figure 4:
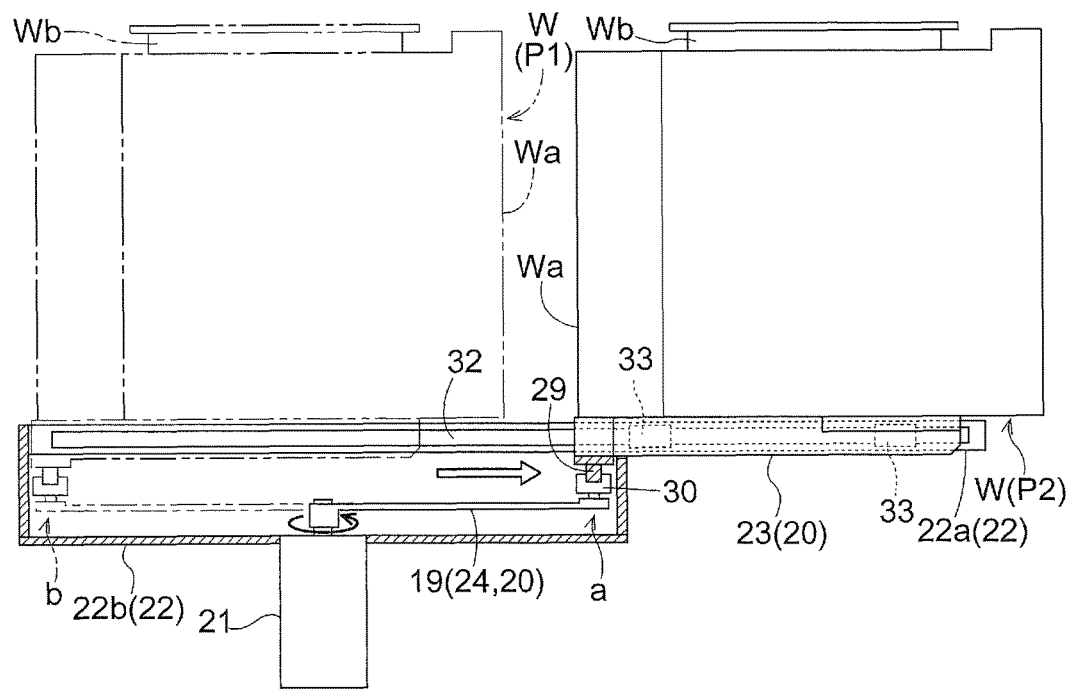
FIG. 4 is a side view of the relay transport device.
Figure 5:
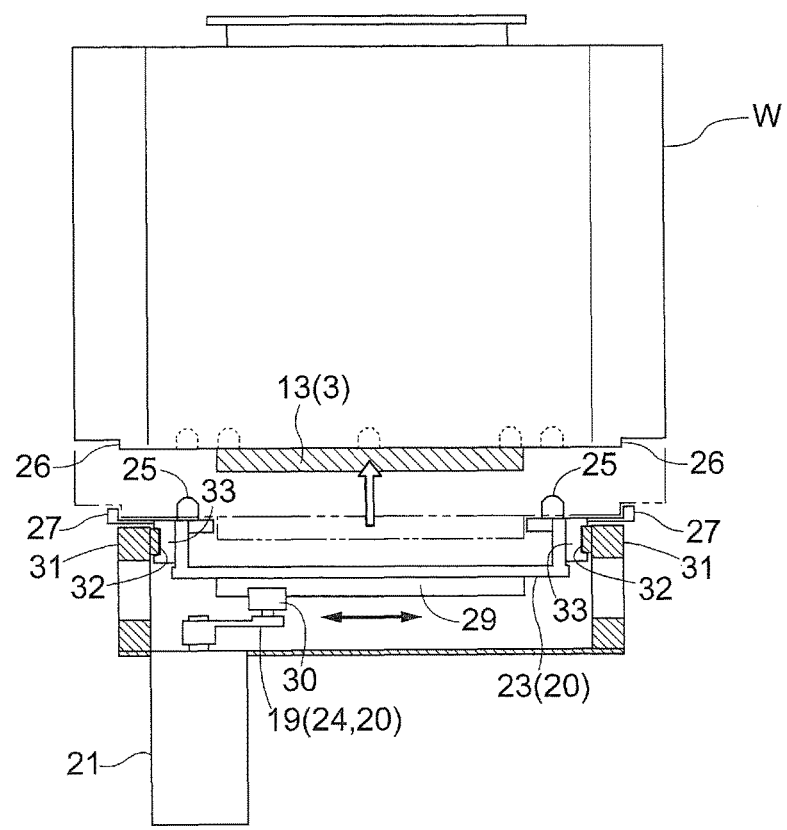
FIG. 5 is a front view of the relay transport device.

As shown in FIGS. 3 and 4, the relay transport device 4 includes a receiving support portion 20 for receiving and supporting an article W, an actuating operation portion 21 for actuating the receiving support portion 20 to move the article W to the inside location P2 and to the outside location P1, and a base frame 22 which supports the receiving support portion 20 as well as the actuating operation portion 21, and which is connected to the article storage rack 2. The receiving support portion 20 includes a receiving member 23 which receives and supports the article W and which is movable along the rack fore and aft direction, and an operatively connecting portion 24 for operatively connecting the receiving member 23 to the actuating operation portion 21 to move the receiving member 23 along the rack fore and aft direction when actuated by the actuating operation portion 21. Note that the rack fore and aft direction refers to the direction which perpendicularly intersects both the rack vertical direction and the rack lateral direction.

And as shown in FIG. 4 with phantom lines, the relay transport device 4 is configured to move the article W received and supported by the receiving support portion 20 to the outside location P1 by moving the receiving support portion 20 to the position that corresponds to the outside location P1 with the actuating operation portion 21. In addition, as shown in FIG. 4 with solid lines, the relay transport device 4 is configured to move the article W received and supported by the receiving support portion 20 to the inside location P2 by moving the receiving support portion 20 to the position that corresponds to the inside location P2 with the actuating operation portion 21.

As shown in FIG. 3, the receiving member 23 is formed to have a U-shape that is recessed toward the back side along the rack fore and aft direction in plan view, and is configured to receive and support a part of the bottom surface of the article W. The receiving and supporting member 13 of the stacker crane 3 is formed to have a shape that allows it to move through the recessed portion of the receiving member 23 along the rack vertical direction, and is formed to have a shape that receives and supports the portion, of the bottom surface of the article W, that is not received and supported by the receiving member 23.

And an article W placed on the receiving and supporting member 13 of the stacker crane 3 can be lowered to the receiving member 23 of the relay transport device 4 by causing the stacker crane 3 to perform the unloading operation with the receiving member 23 moved to the position that corresponds to the inside location P2. In addition, an article W placed on the receiving member 23 of the relay transport device 4 can be picked up by the receiving and supporting member 13 of the stacker crane 3 by causing the stacker crane 3 to perform the pick up operation.

Incidentally, the support platform 7 of the article storage rack is also formed to have a U-shape in plan view similarly to the receiving member 23 and is configured such that an article W can be lowered to the support platform 7 by the unloading operation of the stacker crane 3 and such that an article W can be picked up from the support platform 7 by the pick up operation of the stacker crane 3.

The receiving member 23 has engaging pins 25 for engaging recessed portions formed in the bottom surface of the article W and engaging bodies 27 located at lateral sides of, or laterally adjacent, contacted portions 26 of the article W. And these engaging pins 25 and the engaging bodies 27 restrict horizontal movement of the article W on the receiving member 23.

Incidentally, the contacted portions 26 of the article W are formed to be recessed in the rack lateral direction so that the engaging bodies 27 are located within the lateral width of the article W. And the width, along the rack lateral direction, of the receiving member 23 having these engaging bodies 27 is set to be less than the width, along the rack lateral direction, of the article W.

The operatively connecting portion 24 is, or consists of, a bar-shaped link 19 whose proximal end portion is connected to the actuating operation portion 21 and whose distal end portion is connected to a back side end portion, along the rack fore and aft direction, of the receiving member 23.

To describe further the connection between this link 19 and the receiving member 23, a right-and-left direction guide rail 29 is provided on an undersurface of the back side end portion of the receiving member 23 to extend along the rack lateral direction. And a right-and-left direction movement block 30 that engages the right-and-left direction guide rail 29 is connected at a distal end portion of the link 19 so as to be movable along the rack lateral direction. The link 19 is connected to the receiving member 23 through the linear guide consisting of these right-and-left direction guide rail 29 and the right-and-left direction movement block 30 so that the link 19 is connected to the back side end of the receiving member 23 such that the link 19 is movable along the rack lateral direction with respect to the receiving member 23 and moves integrally with the receiving member 23 along the rack fore and aft direction.

The base frame 22 includes a pair of frame members 31 extending along the rack fore and aft direction such that they are spaced apart from each other along the rack lateral direction. And a fore-and-aft direction guide rail 32 extending along the rack fore and aft direction is provided to each of the surfaces, of the pair of frame members 31, that face each other. In addition, fore-and-aft direction movement blocks 33 that engage the fore-and-aft direction guide rails 32 are connected to both end portions, along the rack lateral direction, of the receiving member 23, so as to be movable along the rack fore and aft direction. The receiving member 23 is connected to the pair of frame members 31 through the pair of linear guides which consist of these fore-and-aft direction guide rails 32 and the fore-and-aft direction movement blocks 33 so that the receiving member 23 is supported by the base frame 22 such that the receiving member 23 is movable along the rack fore and aft direction and unmovable along the rack lateral direction.

The actuating operation portion 21 consists of an electric motor with reduction gears, and is provided in such an attitude that the pivot axis of the output shaft extends along the rack vertical direction. The proximal end portion of the link 19 is directly connected to the output shaft of this actuating operation portion 21 so that the actuating operation portion 21 causes the link 19 to rock, or pivot back and forth, about the vertical axis.

And as the link 19 is caused to rock by the actuating operation portion 21, the receiving member 23 is pushed and pulled along the rack fore and aft direction by the link 19 while the distal end portion of the link 19 moves along the rack lateral direction with respect to the receiving member 23. Thus, the receiving member 23 is configured to be moved straight along the rack fore and aft direction between a position corresponding to the outside location P1 and a position corresponding to the inside location P2 by the virtue of the fact that the actuating operation portion 21 causes the link 19 to rock to push and pull the receiving member 23 with the link 19 that is rocking back and forth.

And the link 19 is connected to the undersurface of the back side end portion of the receiving member 23. And the connecting location between this link 19 and the receiving member 23 is set to be such a position that the connecting location is located directly below the article W placed on the receiving member 23.

In addition, the article W located at the inside location P2 is displaced rearward relative to an article W located on a storage section 1. And a back end portion of the article W located at the inside location P2 protrudes rearward relative to the back face of the article storage rack 2. As such, the inside location P2 is such a location that a part of the article W is located rearward of the back face of the article storage rack 2. And even when the connecting location between the link 19 and the receiving member 23 is set to be such a position that the connecting location is located directly below the article W placed on the receiving member 23 as described above, the connecting location is located rearward of articles W stored in the storage sections 1 with the receiving member 23 moved to the position corresponding to the inside location P2.

Thus, the link 19 (operatively connecting portion 24) is connected to the back side end portion of the receiving member 23 and is provided rearward, along the rack fore and aft direction, of articled W stored in the storage sections 1.

Incidentally, since the article W located at the inside location P2 is displaced rearward relative to an article W located in a storage section 1 as described above, the amount of projection from the retracted position to the projected position when the stacker crane 3 performs the pick up operation from and the unloading operation to the inside location P2 is set to be greater than when performing the pick up operation from and the unloading operation to a storage section 1.

Also, the relay transport device 4 is provided such that an article W located at the inside location P2 is located at the same position as an article W stored in the storage section 1 located directly in front of the inside location P2 along the rack vertical direction and the rack lateral direction so that the stop position for the vertically movable platform 11 when performing the pick up operation to and the unloading operation from the inside location P2 is the same position as the stop position for the vertically movable platform 11 when performing the pick up operation from and the unloading operation to the storage section 1 located directly in front of the inside location P2.

As shown in FIG. 3, the actuating operation portion 21 is provided at an intermediate position of the moving range, along the rack fore and aft direction, of the distal end portion of the link 19. To describe in more detail, the actuating operation portion 21 is located, along the rack fore and aft direction, between an outside position "b" at which the distal end portion of the link 19 is located when the receiving member 23 has been moved to the position corresponding to the outside location P1 and an inside position "a" at which the distal end portion of the link 19 is located when the receiving member 23 has been moved to the position corresponding to the inside location P2. More specifically, the actuating operation portion 21 is provided at the middle point between the outside position "b" and the inside position "a" along the rack fore and aft direction.

Thus, when the receiving member 23 has been moved to the position corresponding to the outside location P1, the attitude of the link 19 is tilted toward the back side from the attitude of the link 19 along the rack lateral direction. In addition, when the receiving member 23 has been moved to the position corresponding to the inside location P2, the attitude of the link 19 is tilted toward the front side from the attitude of the link 19 along the rack lateral direction.

And the relay transport device 4 is configured to cause the actuating operation portion 21 to operate at a constant speed to rock the link 19 at constant angular speed. Because the relay transport device 4 rocks the link 19 at a constant angular speed in this manner, the moving speed of the receiving member 23 increases gradually until the attitude of the link 19 is along the rack lateral direction, and thereafter gradually decreases to move the receiving member 23 to the position corresponding to the inside location P2 or to the outside location P1.

As shown in FIG. 1, the base frame 22 of the relay transport device 4 is formed such that its front side portion 22a is formed to be thinner along the rack vertical direction than its back side portion 22b, and is provided such that its back side portion 22b is located rearward of the articles W stored in the storage sections 1 and such that the front side portion 22a is located between an article W located at the inside location P2 and an article W stored in the storage section 1 located downwardly adjacent the inside location P2.

And as shown in FIG. 2, the relay transport device 4 (the back side portion 22b of the base frame 22 and the actuating operation portion 21) is provided at a position at which the relay transport device 4 overlaps with an article W stored in the storage section 1 located downwardly adjacent the inside location P2, as seen along the rack fore and aft direction.

The actuating operation portion 21 is supported by the back side portion 22b such that the actuating operation portion 21 projects downwardly from the lower end of the back side portion 22b, and the back side portion 22b is located rearward of articles W stored in the storage sections 1.

In addition, the actuating operation portion 21 is provided between the pair of frame members 31, and is provided such that it is accommodated within the width, along the rack lateral direction, of the base frame 22.

As shown in FIG. 6, the pair of frame members 31 which define the front side portion 22a of the base frame 22, as well as the pair of fore-and-aft direction guide rails 32, are provided such that they are spaced apart from each other by a distance smaller than the lateral width of the container main body Wa which is a portion of an article W that has the largest lateral width. That is, as shown in FIG. 2, the width, along the rack lateral direction, of the relay transport device 4 is formed to be narrower than the width, along the rack lateral direction, of the article W.

In addition, the pair of frame members 31 which define the front side portion 22a of the base frame 22, as well as the pair of fore-and-aft direction guide rails 32, are provided such that they are spaced apart from each other by a distance larger than the lateral width of the top flange Wb. In addition, with the receiving member 23 moved to the position corresponding to the inside location P2, the entire top flange Wb of the article W stored in the storage section 1 located downwardly adjacent the inside location P2 overlaps with the recessed portion of the receiving member 23 as seen along the rack vertical direction.

Thus, even if the top flange Wb of the article W is located at a position at which it overlaps with the relay transport device 4 along the rack lateral direction (the positions along the rack lateral direction overlap), the top flange Wb would be located between the pair of frame members 31 and the pair of fore-and-aft direction guide rails 32, and would be located in the recessed portion of the receiving member 23 as shown in FIG. 6. That is, the relay transport device 4 is configured such that the article W would not interfere with it when carrying in or out an article W with the stacker crane 3 to or from the storage section 1 downwardly adjacent the inside location P2.

As described above, since the actuating operation portion 21 and the operatively connecting portion 24 are provided rearward, along the rack fore and aft direction, of articles W stored in storage sections 1, the actuating operation portion 21 and the operatively connecting portion 24 would not be located between an article W located at the inside location P2 and an article W stored in the storage section 1 located downwardly adjacent the inside location P2 even when the article W has been moved to the inside location P2. Thus, there is no need for installation space, between the inside location P2 and the storage section 1 located downwardly adjacent thereto, for allowing the movements of the actuating operation portion 21 and the operatively connecting portion 24; thus, the relay transport device 4 can be installed while reducing any reduction in the storage efficiency of the article storage facility. In the present embodiment, the relay transport device 4 can be provided in an area or space for installing one storage section 1.

Alternative Embodiments (1) In the embodiment described above, the operatively connecting portion 24 and the receiving member 23 are connected to each other at the position at which they overlap with an article W placed on the receiving member 23 as seen along the rack vertical direction; however, the receiving member 23 may be formed to have a shape that extends rearward from the article W placed on the receiving member 23. And the operatively connecting portion 24 may be connected to the rearwardly extending portion of the receiving member 23 so that the operatively connecting portion 24 and the receiving member 23 are connected to each other at a position rearward of the article W placed on the receiving member 23.

(2) In the embodiment described above, the receiving support portion 20 includes the operatively connecting portion 24 which operatively connects the actuating operation portion 21 which is fixedly provided and not movable along the rack fore and aft direction and the receiving member 23 which is movable along the rack fore and aft direction; however, the receiving support portion 20 does not need to include the operatively connecting portion 24. More specifically, a movable carriage including an actuating operation portion 21 and a receiving member 23 (receiving support portion 20) may be provided so that the actuating operation portion 21 can move integrally with the receiving member 23 along the rack fore and aft direction. And the receiving member 23 (receiving support portion 20) may be moved between the position corresponding to the inside location P2 and the position corresponding to the outside location P1 by causing the movable carriage to move along the rack fore and aft direction through the actuation or operation of the actuating operation portion 21.

(3) In the embodiment described above, the operatively connecting portion 24 which operatively connects the actuating operation portion 21 and the receiving member 23 to each other is, or consists of, the link 19; however, the operatively connecting portion 24 may consists of a rack and a pinion, or may be a timing belt.

In addition, the actuating operation portion 21 and the operatively connecting portion 24 may be formed by a cylinder extendable along the rack fore and aft direction. In this case, its cylinder body may be provided as the actuating operation portion 21. And its cylinder rod may function as the operatively connecting portion 24 and its distal end portion may be connected to the receiving member 23.

(4) In the embodiment described above, the width, along the rack lateral direction, of the back side transport device is formed to be smaller than the width, along the rack lateral direction, of the article W; however, the width, along the rack lateral direction, of the back side transport device may be formed to be larger than the width, along the rack lateral direction, of the article W.

In addition, the inside location P2 is defined to be located between storage sections 1 arranged along the rack lateral direction; however, the inside location P2 may be defined at an end, along the rack lateral direction, of the article storage rack 2 and does not need to be defined between the storage sections 1 arranged along the rack lateral direction.

(5) In the embodiment described above, the ceiling transport vehicle 5 is configured to transfer articles W to or from the outside locations P1; however, the articles W may be transferred to and from the outside locations P1 by means of other transport device, such as a conveyor or a stacker crane. In addition, a worker may place the article W on the outside location P1 without providing such a transport device.

DESCRIPTION OF REFERENCE NUMERALS AND SYMBOLS

1 Storage Section
2 Article Storage Rack
3 Front Side Transport Device
4 Back Side Transport Device
15 Travel Rail
16 Support Body
19 Link
20 Receiving Support Portion
21 Actuating Operation Portion
23 Receiving Member
24 Operatively Connecting Portion
P1 Outside Location
P2 Inside Location
W Article

The invention claimed is:

1. An article storage facility comprising:
an article storage rack including storage sections for storing articles with the storage sections being arranged along a rack vertical direction;
a front side transport device provided in front of the article storage rack in a rack fore and aft direction for carrying in and out articles to and from the storage sections;
a back side transport device which can support and transport an article between an outside location located rearward of a back face of the article storage rack along the rack fore and aft direction and an inside location located forwardly of the back face of the article storage rack along the rack fore and aft direction;
wherein the inside location is defined between the storage sections arranged along the rack vertical direction,
wherein the front side transport device is configured to be capable of transporting an article between the inside location and the storage sections,
wherein the back side transport device includes a receiving support portion for receiving and supporting an article, and an actuating operation portion for actuating the receiving support portion in order to move an article to the inside location and to the outside location,
wherein the actuating operation portion is provided rearward of articles stored in the storage sections along the rack fore and aft direction,
wherein the receiving support portion includes a receiving member for receiving and supporting an article and movable along the rack fore and aft direction, and an operatively connecting portion for operatively connecting the receiving member and the actuating operation portion,
wherein the operatively connecting portion is configured to rotate about a vertical axis to move the receiving member along the rack fore and aft direction when actuated by the actuating operation portion, and
wherein the operatively connecting portion is connected to a rear portion, along the rack fore and aft direction, of the receiving member, and is provided rearward of articles stored in the storage sections along the rack fore and aft direction.

2. The article storage facility as defined in claim 1, wherein the operatively connecting portion consists of a bar-shaped link whose proximal end portion is connected to the actuating operation portion and whose distal end portion is connected to the rear portion of the receiving member, and
wherein the actuating operation portion is configured to move the receiving member along the rack fore and aft direction by rocking the link, and is provided at an intermediate position in a moving range, along the rack fore and aft direction, of the distal end portion of the link.

3. The article storage facility as defined in claim 1, wherein the article storage rack includes the storage sections with the storage sections being arranged along a rack lateral direction,
wherein the inside location is defined between the storage sections arranged along the rack lateral direction, and
wherein the width, along the rack lateral direction, of the back side transport device is formed to be narrower than the width, along the rack lateral direction, of an article.

4. The article storage facility as defined in claim 1, wherein a ceiling transport vehicle is provided which is capable of traveling along a travel rail while guided and supported by the travel rail installed to a ceiling, and which includes a support body for supporting an article such that the support body can be vertically moved,
wherein the travel rail is provided so as to extend above the outside location, and
wherein the ceiling transport vehicle is configured to vertically move the support body to transfer an article to and from the outside location.

* * * * *